United States Patent
Rubenstein et al.

(10) Patent No.: US 7,619,899 B2
(45) Date of Patent: Nov. 17, 2009

(54) SECURABLE ELECTRONIC MODULE

(75) Inventors: Brandon Rubenstein, Loveland, CO (US); Stephan Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 755 days.

(21) Appl. No.: 10/919,998

(22) Filed: Aug. 17, 2004

(65) Prior Publication Data

US 2006/0037776 A1 Feb. 23, 2006

(51) Int. Cl.
*H05K 1/14* (2006.01)

(52) U.S. Cl. ...................................... 361/740; 361/807

(58) Field of Classification Search ......... 361/807–810, 361/600, 679, 704, 688, 715, 740, 748, 760, 361/783; 174/138 G; 165/80
See application file for complete search history.

(56) References Cited

U.S. PATENT DOCUMENTS

| | | | | |
|---|---|---|---|---|
| 3,728,584 | A * | 4/1973 | Kuhlow | 361/712 |
| 4,856,151 | A | 8/1989 | Fujimoto | |
| 5,473,510 | A * | 12/1995 | Dozier, II | 361/719 |
| 5,485,585 | A * | 1/1996 | Huynh et al. | 710/305 |
| 5,719,443 | A | 2/1998 | Messina | |
| 5,786,989 | A | 7/1998 | Kawabe | |
| 5,903,439 | A * | 5/1999 | Tamarkin | 361/742 |
| 6,212,074 | B1 * | 4/2001 | Gonsalves et al. | 361/717 |
| 6,280,202 | B1 * | 8/2001 | Alden et al. | 439/66 |
| 6,307,748 | B1 * | 10/2001 | Lin et al. | 361/704 |
| 6,317,328 | B1 * | 11/2001 | Su | 361/704 |
| 6,483,704 | B2 * | 11/2002 | Ulen et al. | 361/704 |
| 6,493,233 | B1 | 12/2002 | De Lorenzo et al. | |
| 6,542,372 | B1 | 4/2003 | Paquin et al. | |
| 6,549,410 | B1 | 4/2003 | Cohen | |
| 6,693,751 | B2 | 2/2004 | Morii et al. | |
| 6,711,030 | B2 * | 3/2004 | Akiba | 361/803 |
| 6,968,889 | B2 * | 11/2005 | Wang et al. | 165/80.1 |
| 7,044,011 | B2 * | 5/2006 | Encinias et al. | 73/865.9 |
| 7,262,969 | B2 * | 8/2007 | Lee et al. | 361/704 |
| 2002/0176233 | A1 | 11/2002 | Evans | |
| 2003/0119357 | A1 | 6/2003 | Lin et al. | |
| 2003/0142485 | A1 | 7/2003 | Szu | |
| 2003/0210532 | A1 | 11/2003 | Le et al. | |
| 2004/0100777 | A1 | 5/2004 | Lee | |

OTHER PUBLICATIONS

Western Electric, "A screw having two spaced sets of threads of unequal diameter, Teachincal Digest No. 34", Apr. 1974.*
Hewlett-Packard Company, "Breakthrough Innovation Scales Standards-based HP Integrity Servers to 128 Processors, Delivering Greater Value to Customers", May 5, 2004.

* cited by examiner

*Primary Examiner*—Hung S Bui

(57) ABSTRACT

Example systems and methods associated with positioning and securing an electronic module to a circuit board are described. In one embodiment, an electronic module comprises at least one connectible portion configured to connect to a circuit board and at least one extended portion having an opening therethrough. In one example, the opening can be configured to maintain a threaded device and to allow the threaded device to move within the opening. The threaded device can be configured to engage a securing device for adjustably securing the at least one extended portion to the circuit board.

21 Claims, 6 Drawing Sheets

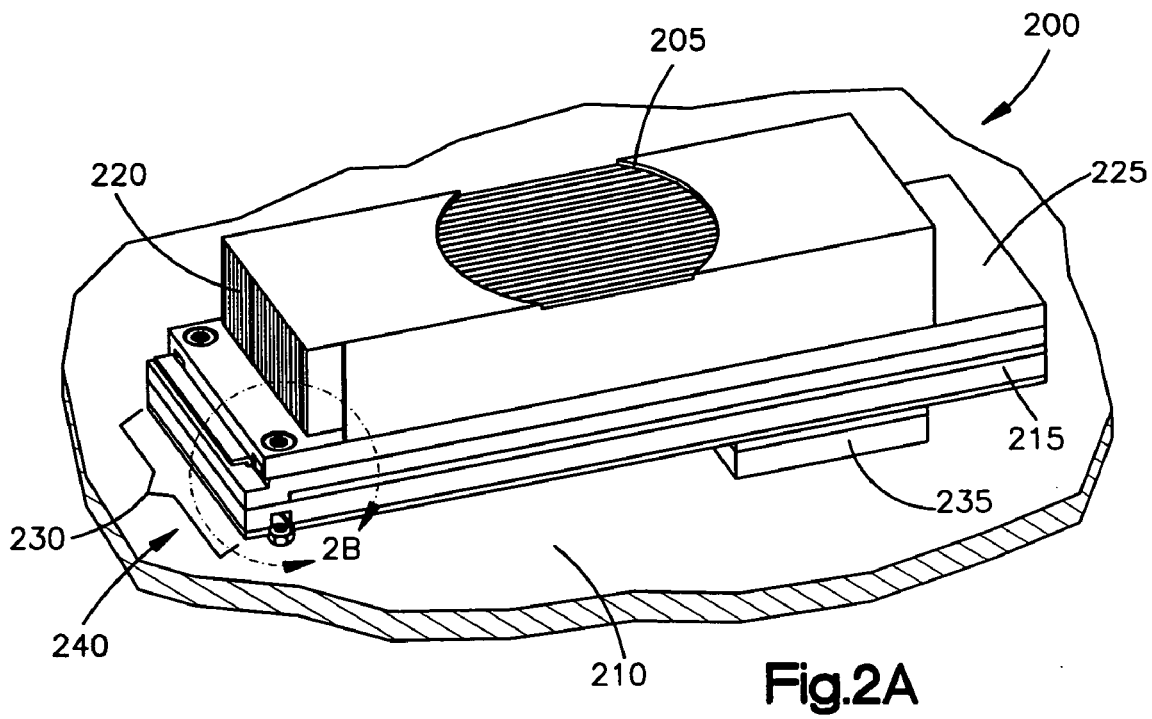
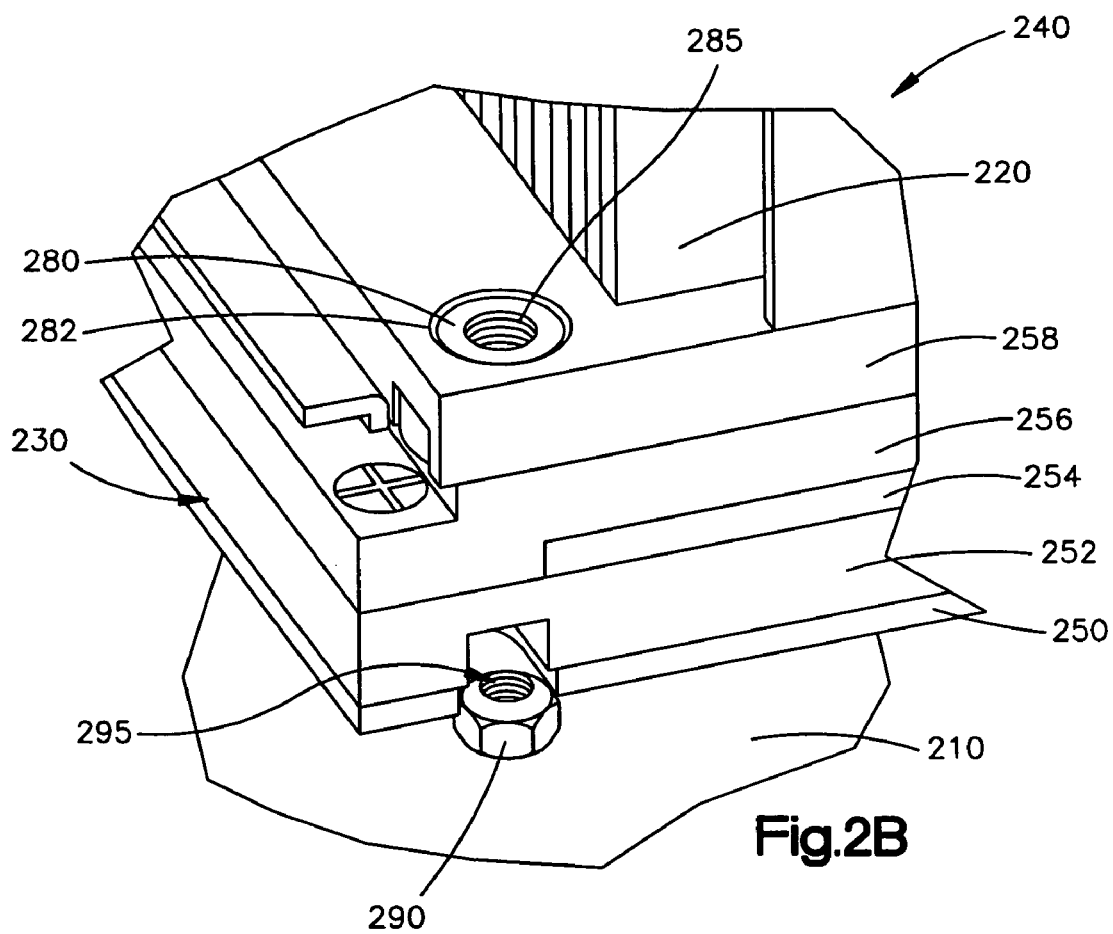

SECURABLE ELECTRONIC MODULE

BACKGROUND

Circuit boards with attached electronic components are used in many applications. One type of electronic component attached or connected to a circuit board may include electronic packages or modules, such as processor modules, chips and the like. Processor modules may be mounted and connected to a circuit board using a connector on the module that mates with a socket on the board. Some modules may be large relative to the size of the socket and may have portions that extend beyond the area of the socket. The extended portions of the module may be elevated above the circuit board and may not be in contact with the board. Such extended portions of a processor module may move or vibrate during movement of the board or of a device containing the board. Such movement may cause the module, the board, or the connection between the two, to become weakened or damaged.

BRIEF DESCRIPTION OF THE DRAWINGS

The accompanying drawings, which are incorporated in and constitute a part of the specification, illustrate various example systems, methods, and so on, that illustrate various example embodiments of aspects related to securing an extended module portion of an electronic package to a board. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale and distances may be exaggerated for purposes of explanation.

FIG. 2A is a perspective view of an example electronic module with an extended portion positioned on a board.

FIG. 2B is an enlarged view of the boxed region in FIG. 2A, showing an extended portion of an electronic module positioned on a circuit board.

DETAILED DESCRIPTION

Figure 1A:
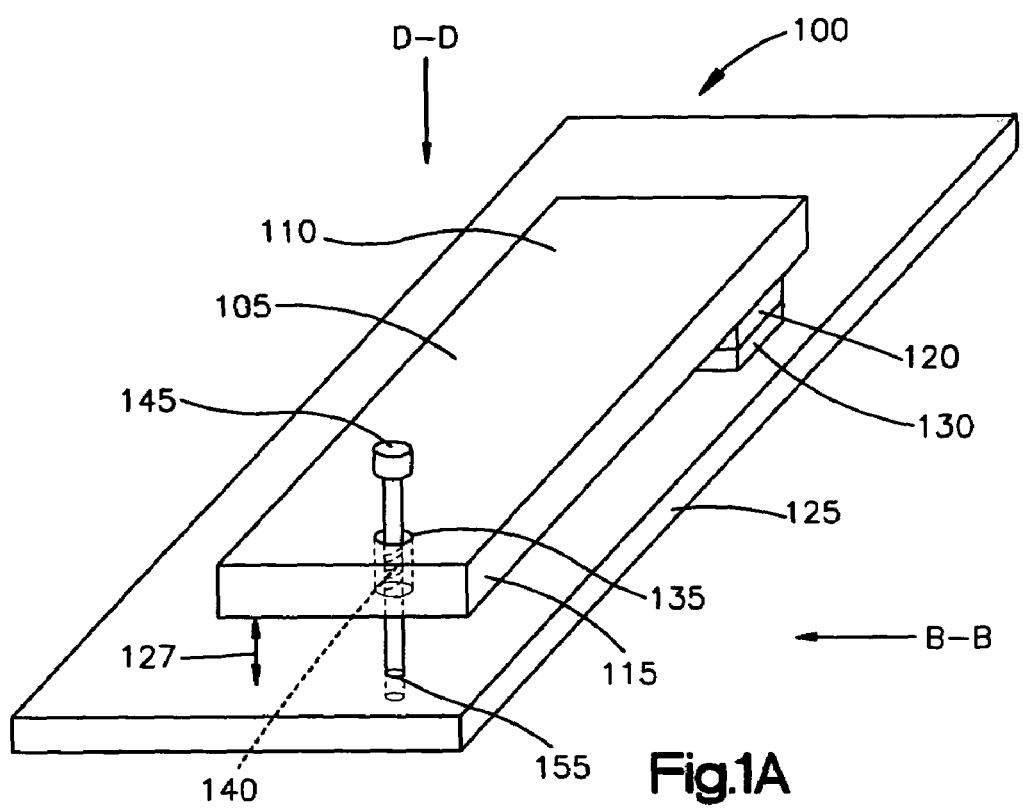
FIG. 1A is a perspective view of an example system for securing an extended portion of a module to a board.

Example systems and methods associated with an electronic module that can be adjustably secured to a board are described herein. In one example, the electronic module may include an extended portion that may be elevated from and initially unattached to a surface of a board (e.g. a circuit board). Additionally, there may be unit-to-unit variations in circuit boards such that the extended portions of electronic modules connected to different circuit boards may be spaced different distances from the boards, may not be parallel to the boards, may be aligned differently, and/or may be susceptible to movement. The variations may be caused, for example, by uneven application of solder used to attach the electronic module to a socket on the board. An example electronic module can include a microprocessor.

An example system or method for adjustably securing the extended portion of a electronic module to a board, (e.g. a circuit board and the like), may include providing an opening in the extended portion of the electronic module that includes a threaded device that can be movable within the opening. A fastener may be used that mates with the threaded device and engages the circuit board. The example systems and methods may be used to adjustably position or secure the extended portion of an electronic module to a circuit board and may accommodate variations in spacing and positioning of the extended portion of the module in relation to a circuit board.

The following includes definitions of selected terms used throughout the disclosure. The definitions include examples of various embodiments and/or forms of components that fall within the scope of a term and that may be used for implementation. The examples are not intended to be limiting and other embodiments may be implemented. Both singular and plural forms of all terms fall within each meaning.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), an analog circuit, a digital circuit, a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

"Electronic package" or "electronic module", as used herein describes a physical logic device that includes one or more components and/or one or more layers. The layers may contain, but are not limited to, one or more of microprocessors, application specific integrated circuits (ASIC), analog circuits, digital circuits, programmed logic devices, memory devices, chips or the like. An electronic package may include other components, such as heat sinks and associated fans for example. An electronic package that includes one or more microprocessors, for example, may be referred to as a "processor module." One example processor module may be an mx2 module manufactured by Hewlett-Packard Company, which includes multiple Intel® Itanium® 2 processors. An electronic module can be configured to be removably connectable to a board like a circuit board, such as through a pin connector on the module that mates with a socket on the board. The connection to the circuit board may alternatively be non-removable, such as by a soldered connection between the module and the board.

Figure 1B:
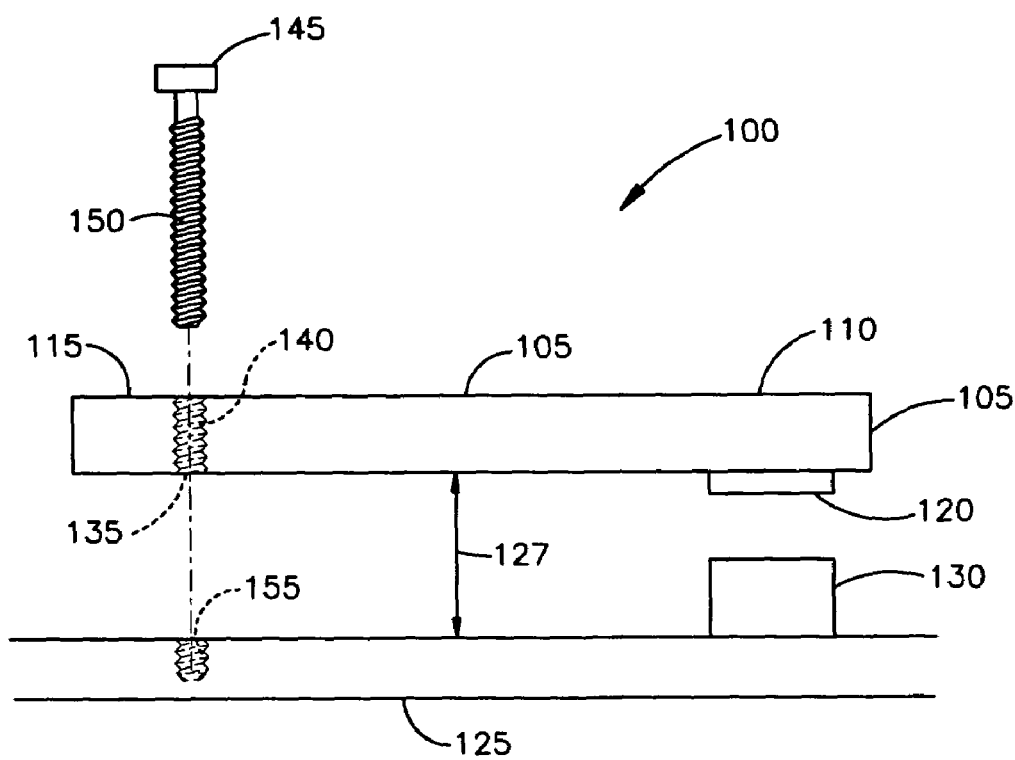
FIG. 1B is an exploded side view of an example system for securing an extended portion of a module to a board.
Figure 1C:
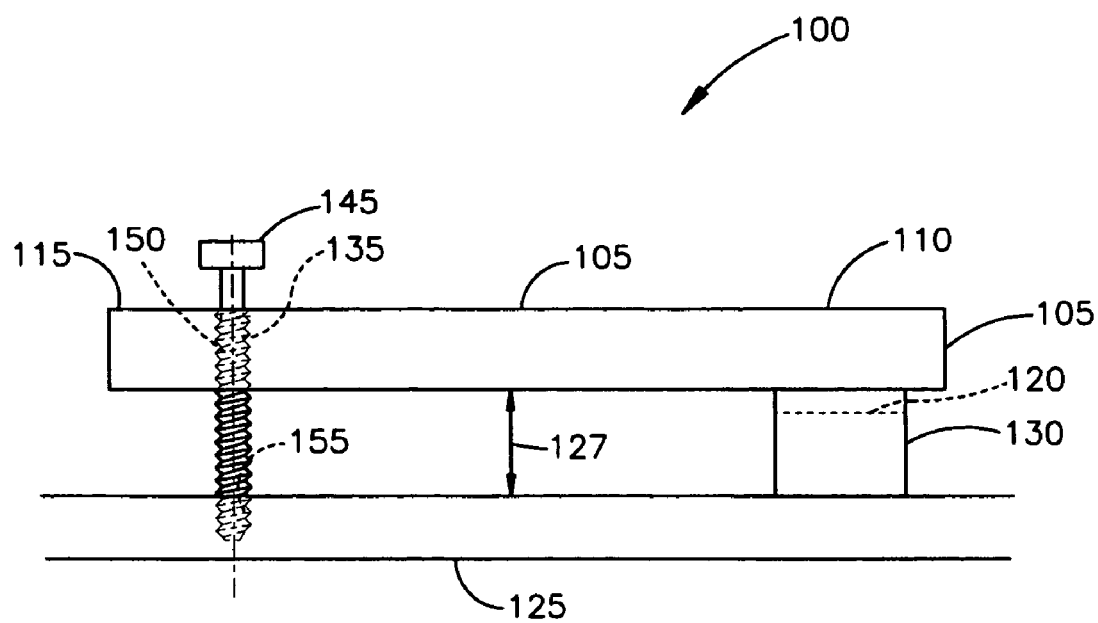
FIG. 1C is a side view of an example system for securing an extended portion of a module to a board.
Figure 1D:
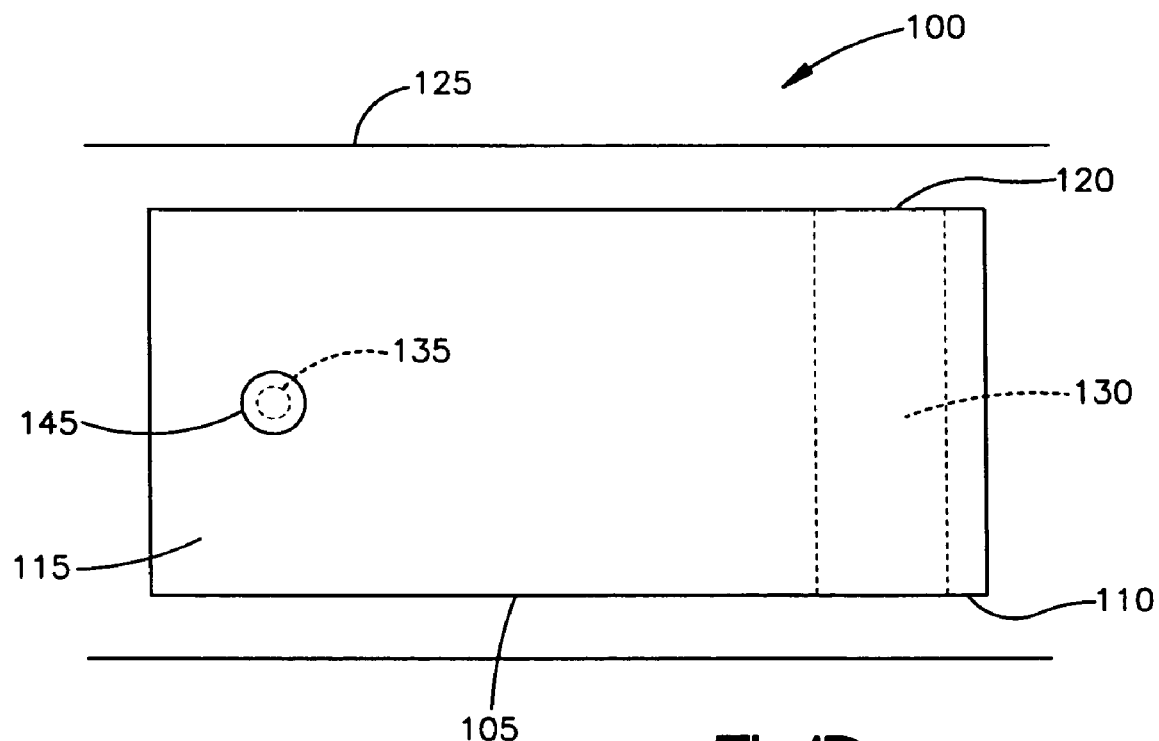
FIG. 1D is a top view of an example system for securing an extended portion of a module to a board.

Illustrated in FIGS. 1A-D are various views of an example system 100 for securing an extended portion of an electronic module to a circuit board. FIG. 1A is a perspective view of the example system 100. FIG. 1B is an exploded side view of FIG. 1A along view B-B showing the example system 100 with unconnected components. FIG. 1C is a side view of FIG. 1A along view B-B showing the example system 100 with connected components. FIG. 1D is a top view of FIG. 1A along view D-D.

Referring to FIGS. 1A-D, an example electronic module 105 can have at least one connectible portion 110 and at least one extended portion 115. The connectible portion 110 may have at least one connector 120, which provides for connection of the module 105 to a circuit board 125. In one example, the connector 120 can be configured with pins that can connect with a socket 130 on the circuit board 125. Of course, other types of connectors can be used. As used herein, the connectible portion 110 of the module 105 refers to an area of the module 105 that is adjacent to and/or contacting the connector 120. As such, the connectible portion 110 is a relatively stable area of the module 105 due to the attachment of the connector 120 to the socket 130 of the circuit board 125. However, the extended portion 115 refers to an area of the module 105 that extends beyond the connectible portion 110 and can be suspended or elevated from the circuit board 125 by a distance 127, where the distance can vary. As shown in FIG. 1B, the extended portion 115 can be generally parallel to the circuit board 125, but may be tilted or offset once the module 105 is connected to the circuit board 125. The extended portion 115 can be regarded as a cantilevered end that may be less stable, in terms of being susceptible to movement, than the connectible portion 110.

To reduce potential movement of the extended portion 115, the extended portion 115 can include a securing mechanism that can adjustably position the extended portion 115 in relation to the circuit board 125. The securing mechanism can include at least one opening 135 through the extended portion 115 of the module 105. In one example, the opening 135 may include threads 140 for engaging a securing device 145 (e.g. a fastener). The threads 140 of the opening 135 may be tapped into the wall of the opening. In another example, the threads 140 of the opening 135 may be provided by a nut that is positioned in the opening 140, which will be described in greater detail below.

With reference to FIG. 1B, the securing device 145 can be generally insertable into the opening 135 of the extended portion 115 of the module 105. The securing device 145 can be configured with one or more portions having threads 150 that are configured to mate with the threads of the opening 140 when the device 145 is inserted therethrough. The securing device 145 can also engage the circuit board 125. In the illustrated example, the securing device 145 engages the circuit board 125 through a receptor 155 on the circuit board. One example type of receptor 155 may be a standoff, or may be an opening. The portion of the securing device 145 that engages the receptor 155 may be unthreaded and may engage an unthreaded receptor. For example, the securing device 145 may be snap-fitted into the receptor 155. In another example, the portion of the securing device that engages the receptor 155 may be threaded and may engage threads of a receptor 155.

With reference to FIG. 1C, the example electronic module 105 can be of a plank-type design, based on its relatively long length as compared to the length of the socket 130 to which it is connected. The module 105 is shown in one example as being connected to the socket 130 and having the extended portion 115 secured to the circuit board 125 with the securing device 145. By positioning the securing device 145 (e.g. by turning), the extended portion 115 can be adjustably positioned relative to the circuit board 125. In this manner, the extended portion 115, and thus the module 105, can be adjusted to be substantially parallel to the circuit board 125 and to be less susceptible to movement.

FIG. 2A is a perspective view 200 of another example processor module 205 shown positioned on and connected to a circuit board 210. The processor module 205 is connected to the circuit board, through a connector (not visible) that mates with a socket 235 on the circuit board 210. The example processor module 205 includes multiple layers and is includes a plank-type configuration. A generic example of a plank-type module is shown in FIG. 1C. The processor module 205 can include one or more microprocessors that are embedded in or on a selected layer, for example, layer 215. Other components like a heat sink 220 can be included in or on various layers of the processor module 205. The heat sink 220 may include fins.

Based on the example plank-type design, the processor module 205 has an attachable portion 225 that includes the area around the socket 235, and an elevated portion 230 that extends out from the attachable portion 225 and is elevated from the circuit board 210. Because the socket 235 is raised relative to the surface of the circuit board 210, the elevated portion 230 of the processor module 230 does not contact the circuit board 210. A boxed area 240 of FIG. 2A encloses a corner section of the elevated portion 230 that includes a securing mechanism. The boxed area 240 is enlarged in FIG. 2B.

With reference to FIG. 2B, an example securing mechanism is shown for the extended portion 230 of the processor module 205, as well as the example multilayer design. The processor module 205 can have a plurality of layers such as a processor layer 250 that includes a processor, a structural layer 252, a power board layer 254, a heat spreader layer 256, a base layer 258 of the heat sink 220, and/or other desired layers.

Also shown in the example of FIG. 2B is a threaded device 280 that is part of the securing mechanism for module 205. The threaded device 280 can be positioned within an opening 282 formed in the elevated portion of the processor module. For example, the opening 282 can be formed through one or more selected layers of the processor module, such as the base section 258 of the heat sink 220. As is described in more detail below, the threaded device 280 can be movable within the opening 282 and can be regarded as being able to float within the opening 282. The threaded device 280 has an opening 285 therethrough and can include threads that are configured to mate with threads of a shaft (e.g. example shown in FIG. 4) that is insertable through the opening 285.

The circuit board 210 can include a receptor 290 with which the shaft can also engage. In the illustrated example, the receptor 290 can be a standoff attached to the circuit board 210, or can be an opening in the circuit board. An opening 295 of the receptor 290 is generally alignable with the opening 285 of the threaded device 280 such that a shaft inserted therethrough can also be inserted into the opening of the receptor 290 and engage the circuit board 210. As described previously, the processor module 205 may be differently positioned in different circuit boards that may cause misalignment of the receptor 290 and the opening 282 of the processor module 205. Flexibility in alignment is facilitated by the movability of the threaded device 280 within the opening 282. In one example, when a fastening shaft (not shown) is inserted into the opening 282, the end of the shaft may have threads that engage with threads in the opening of the receptor 290. In another example, the end of the shaft may engage the receptor 290 without using threads. Mating of the shaft with the processor module and engagement of the shaft with the circuit board provides adjustable positioning and securement of the elevated portion of the processor module 205 to the circuit board 210.

Figure 3:
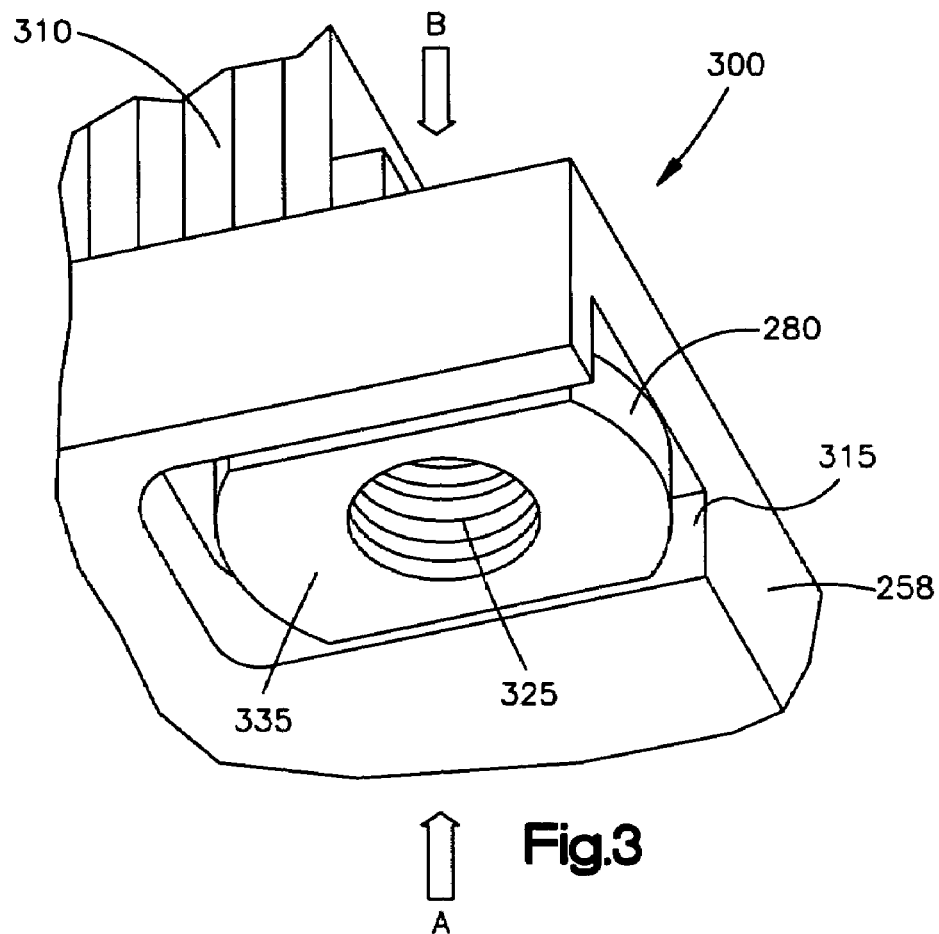
FIG. 3 is a bottom perspective view of an example layer of an electronic module with a securing device received into a slot in the layer.

FIG. 3 is a bottom perspective view 300 of the example layer 258 of a processor module 205 from FIG. 2B showing an example configuration of the threaded device 280 formed as a captive nut. The captive nut 280 can be positioned into a recessed area or slot 315 that is formed in the layer 258. The captive nut 280 includes a portion 325 that extends into the opening 282, which can be seen in FIG. 2B. In one example, the exterior dimensions of the captive nut 280 can be smaller than the dimensions of the opening 282 in the module layer 258. This size relationship allows for the captive nut 280 to be loosely positioned in the opening 282 and allows for side-to-side movement of the captive nut 320 in the opening 282.

In one example, the captive nut 280 includes a flanged portion 335. The flanged portion 335 prevents the captive nut 280 from passing through the opening 282 in the module layer 258 in the direction of arrow A. The dimensions of the flanged portion 335 can be smaller than the dimensions of the slot 315 to allow side-to-side movement of the captive nut 280 in the slot 315.

With further reference to FIG. 3, the layer 258 can be configured to be assembled with another module layer that lays against and contacts the layer 258 in the direction of arrow A. Assembled in this manner, the captive nut 258 is prevented from falling out of the layer 258, for example, in the direction of arrow B. In another example, the captive nut 280 can be configured to have vertical float. For example, the height or thickness of the flanged portion 335 of the captive nut 280 can be less than the depth of the slot 315 to allow for up-and-down movement (e.g. vertical float) of the captive nut 280 within the layer 258. The vertical float of the captive nut 280 can allow a threaded securing device with a ½ thread pitch and double threaded portions to be accommodated, which will be described in the example of FIG. 4. Of course, other thread pitches can be used.

Figure 4:
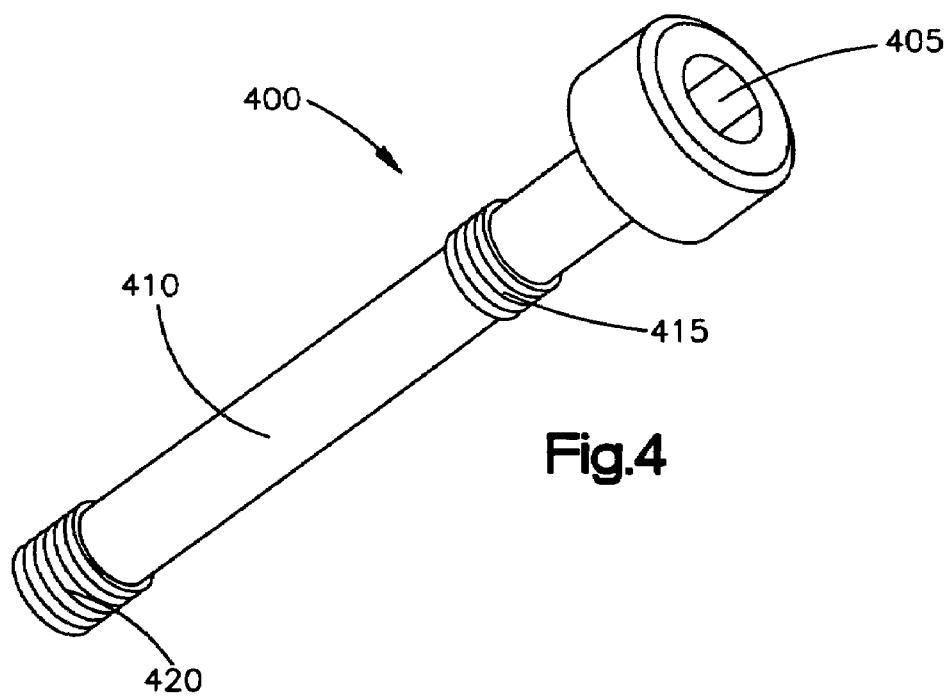
FIG. 4 is a perspective view of an example fastener.

FIG. 4 is a perspective view of an example securing device 400 that can be configured to connect with the captive nut 280 of the processor module 205 and the receptor 290 of the circuit board 210. The securing device 400 can be, for example, a threaded fastener or shaft with one or more threaded portions. In one example, the threaded fastener 400 can have a head 405 and a shaft 410. The shaft 410 can include a first portion 415 that is threaded and is configured to mate with threads of the captive nut 280 in the extended portion of a processor module. A second portion 420 of the shaft 410 is configured to mate with threads of the receptor 290 of the circuit board 210. The two points of engagement with the securing device 400 hold the extended portion of the module in place. As described in a previous example, the captive nut 280 can be configured with vertical float to allow greater alignment tolerances between captive nut 280, the receptor 290, and the securing device 400.

In another example, the second portion may be unthreaded and may engage with the receptor 290 in other ways, for example, by snap-fitting. Other portions of the shaft 410 may or may not have threads. In another example, the shaft 410 may be configured with a generally uniform body. In another example, the shaft 400 can be integral with the processor module and provided as a single component (e.g. the shaft can be pre-inserted and connected to the module). In another example, portions 415 and 420 can have different sized diameters.

Figure 5A:
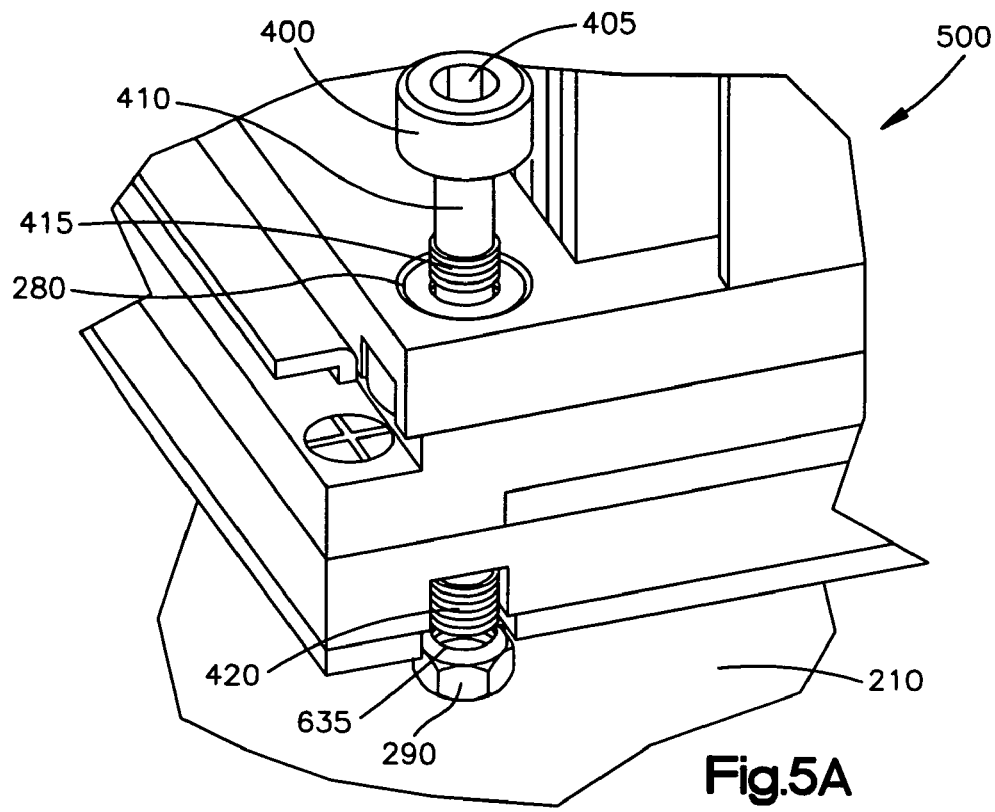
FIG. 5A is a perspective view of the example processor module shown in FIG. 2B including a fastener being inserted to secure the module.
Figure 5B:
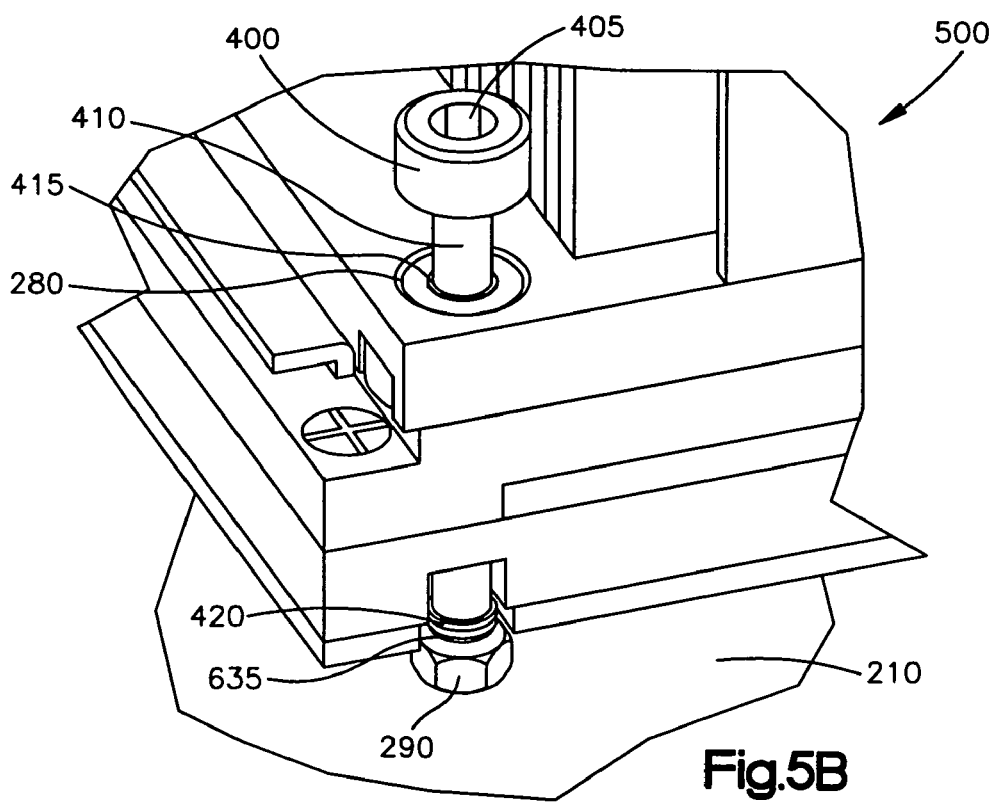
FIG. 5B is the view of FIG. 5A with the fastener inserted.

FIG. 5A is a view 500 of FIG. 2B showing the corner of the example extended portion 230 with the fastener 400 being inserted into the captive nut 280 and into the receptor 290 of the circuit board 210. In the illustrated example, the first portion 415 of the threaded fastener 400 is positioned above and not yet mated with the captive nut 280. The second portion 420 of the threaded fastener 400 is positioned above and not yet engaged with the receptor 290 on the circuit board 210. FIG. 5B illustrates the fastener 400 inserted into and mated with the captive nut 280 and the receptor 290. In this example manner, the extended portion 230 of the processor module 205 is secured to the circuit board 210 and can be adjustably positioned by turning the fastener 400.

With the example systems and equivalent modifications, the processor module 205 can be adjusted to be substantially parallel to the circuit board 210. Movement of the loosely fitting threaded device 280 in the processor module 205 provides flexibility to accommodate variations in the position of the extended portion of the processor module 205 in relation to the circuit board 210. As described previously, the threaded device 280 may have side-to-side movement and/or up-and-down movement within the processor module 205. The movement provides for increased tolerances in the mating of the fastener 400 with the threaded device 280 and engagement of the fastener 400 with the circuit board 210. The movement allows for unit-to-unit variations in the spacing between the processor module and the circuit board, variations in the angle from parallel that the processor module is positioned in relation to the circuit board, and/or horizontal misalignment of the opening of the threaded device 280 with the opening of the receptor 290 on the circuit board.

Figure 6:
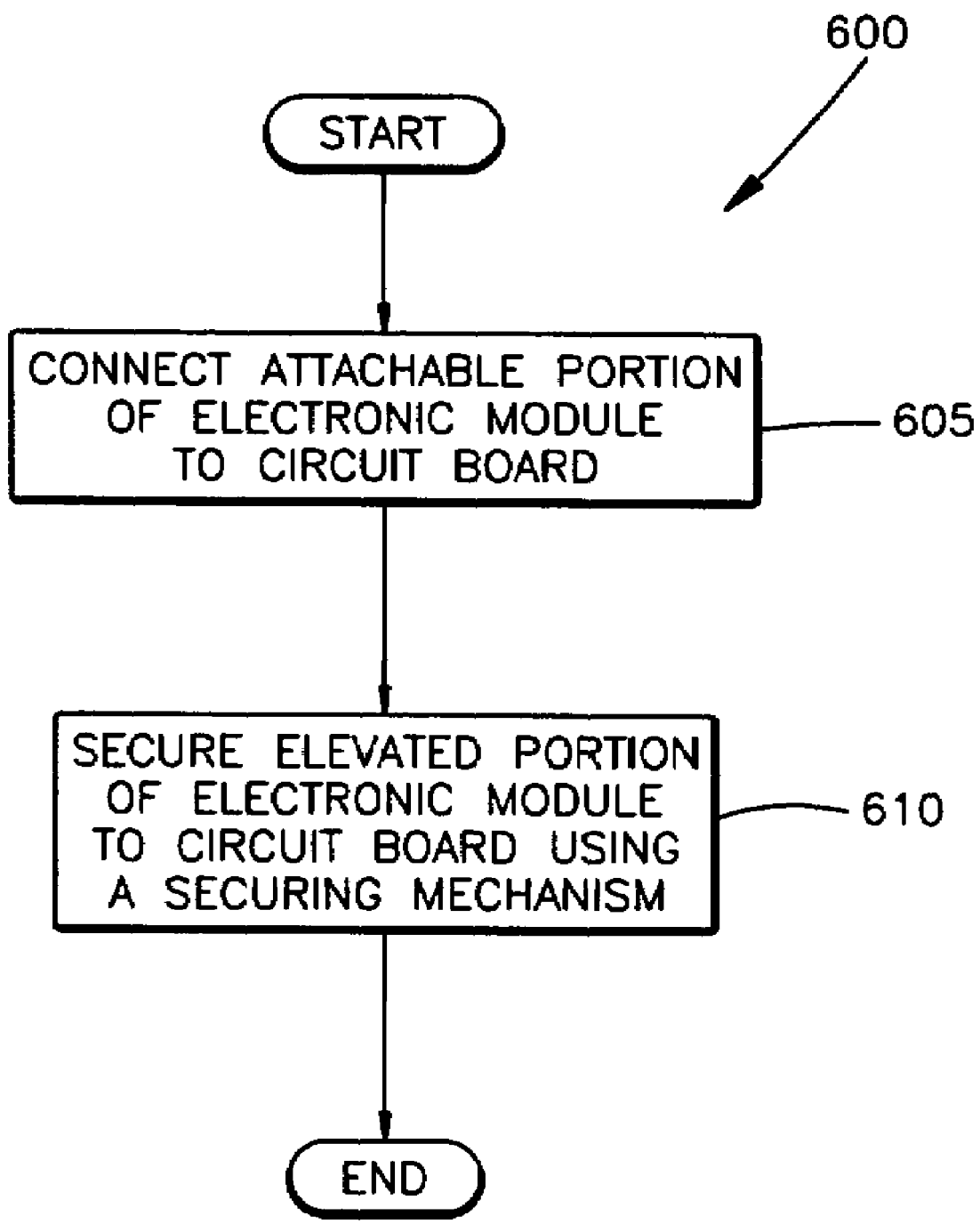
FIG. 6 illustrates an example method associated with securing an electronic module to a board.

Example methods may be better appreciated with reference to the flow diagram of FIG. 6. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various actions occurring in serial, it is to be appreciated that various actions could occur concurrently, substantially in parallel, and/or at substantially different points in time.

Illustrated in FIG. 6 is an example methodology 600, for securing a processor module, which includes an extended portion, to a circuit board. The diagram of FIG. 6, as well as the other illustrated diagrams, are not intended to limit the implementation of the described examples. Rather, the diagrams illustrate functional information one skilled in the art could use to perform the illustrated methods. It will be appreciated that the methods may involve dynamic and flexible processes such that the illustrated blocks can be performed in other sequences different than the one shown and/or blocks may be combined or separated into multiple components. Blocks may also be performed concurrently or at substantially different points in time. The foregoing applies to all methodologies described herein.

With reference to FIG. 6, the method 600 may include connecting an attachable portion of an electronic module to a circuit board (block 605). The method 600 may also include securing an elevated portion of the electronic module to the circuit board using a securing mechanism (block 610). The elevated portion can then be adjustably positioned by configuring the securing mechanism in any of the previously described examples. This allows the securing process to be adaptive to variations in distance and/or alignment between the elevated portion and the circuit board. In another example, the securing block 610 can include providing a shaft having threads that engage the elevated portion and the circuit board. The method 600 can also include providing a threaded device that is loosely fitted into the elevated portion that allows for adjustable engagement with the securing mechanism (e.g. the shaft).

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While the present invention has been illustrated by the description of embodiments thereof, and while the embodiments have been described in considerable detail, it is not the intention of the applicants to restrict or in any way limit the scope of the appended claims to such detail. The invention, in its broader aspects, is not limited to the specific details, the representative apparatus, and illustrative examples shown and described. Additional advantages and modifications will readily appear to those skilled in the art. It is intended that the embodiments described herein be construed as including all such alterations and modifications insofar as they come within the scope of the appended claims or the equivalence thereof. Accordingly, departures may be made from such details without departing from the spirit or scope of the applicant's general inventive concept.

What is claimed is:

1. An electronic module comprising:
   at least one connectible portion configured to connect to a circuit board; and
   at least one extended portion having an opening therethrough, the opening configured with a female threaded device therein and to allow the female threaded device to move in a direction parallel to the extended portion while being retained within the opening; the female threaded device engaging a male securing device for adjustably securing the at least one extended portion to the circuit board.

2. The electronic module of claim 1, where the female threaded device comprises a nut that is loosely positioned in the opening.

3. The electronic module of claim 2, where the nut includes a flanged portion that prohibits the nut from passing through the opening.

4. The electronic module of claim 1, where the female threaded device and the male securing device provide for adjustable positioning of the at least one extended portion to be substantially parallel to the circuit board.

5. The electronic module of claim 1, where the electronic module includes a plank-type processor module.

6. A system, comprising:
   a processor module having at least a first portion configured to connect to a circuit board, and a second portion extending beyond the first portion and being unconnected to the circuit board, the second portion having an opening;
   a female threaded device positioned in the opening; and
   a shaft having threads configured to mate with the female threaded device, pass through the opening and to engage with a receptor of the circuit board to secure the second portion to the circuit board;
   where the first portion of the processor module includes a connector configured to electrically and mechanically connect to a socket on the circuit board.

7. The system of claim 6, where the mating of the shaft to the second portion and the engagement of the shaft with the circuit board provides adjustable securement of the second portion relative to the circuit board.

8. The system of claim 6, where the female threaded device is loosely fitted in the opening.

9. The system of claim 6, where the female threaded device is a captive nut.

10. The system of claim 6, where the female threaded device includes a flanged portion that prohibits the female threaded device from passing through the opening.

11. The system of claim 10, where the second portion of the processor module includes a slot for receiving the flanged portion of the female threaded device.

12. The system of claim 6 where the female threaded device is movable within the opening of the second portion of the processor module.

13. The system of claim 6, where the shaft includes a first portion that mates with the female threaded device and a second portion that engages the receptor of the circuit board.

14. The system of claim 6, the second portion of the processor module being spaced a distance from the circuit board and being substantially parallel to the circuit board.

15. The system of claim 6, where the receptor is configured to engage with an unthreaded portion of the shaft.

16. The system of claim 6, where the shaft attaches the second portion of the processor module to the circuit board.

17. The system of claim 6, where the shaft accommodates variable distances between the second portion of the processor module and the circuit board.

18. The system of claim 6, where the processor module and the shaft are a single component.

19. The system of claim 6, where the processor module includes a plank-type configuration.

20. An electronic device comprising:
   a circuit board having a socket configured to connect a processor module thereto;
   a processor module having a connectible portion connected to the socket and having a cantilevered end that extends beyond the connectible portion, the cantilevered end being generally parallel with the circuit board and being spaced a distance therefrom;
   a captive nut mounted in and movable within the cantilevered end; and
   a threaded fastener securing the cantilevered end of the processor module to the circuit board by engaging the captive nut at a first portion of the threaded fastener and engaging the circuit board at a second portion of the threaded fastener.

21. The electronic device of claim 20, where the processor module is configured as a plank-type module.

* * * * *

UNITED STATES PATENT AND TRADEMARK OFFICE
CERTIFICATE OF CORRECTION

PATENT NO. : 7,619,899 B2  Page 1 of 1
APPLICATION NO. : 10/919998
DATED : November 17, 2009
INVENTOR(S) : Rubenstein et al.

It is certified that error appears in the above-identified patent and that said Letters Patent is hereby corrected as shown below:

In column 8, line 26, in Claim 12, delete "claim 6" and insert -- claim 6, --, therefor.

In column 8, line 32, in Claim 14, after "claim 6," insert -- where --.

Signed and Sealed this

Sixteenth Day of February, 2010

David J. Kappos
*Director of the United States Patent and Trademark Office*